United States Patent
Cheng et al.

(10) Patent No.: US 7,176,571 B2
(45) Date of Patent: Feb. 13, 2007

(54) NITRIDE BARRIER LAYER TO PREVENT METAL (CU) LEAKAGE ISSUE IN A DUAL DAMASCENE STRUCTURE

(75) Inventors: Yi-Lung Cheng, Taipei (TW); Ying-Lung Wang, Taichung (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 147 days.

(21) Appl. No.: 10/753,637

(22) Filed: Jan. 8, 2004

(65) Prior Publication Data

US 2005/0153537 A1 Jul. 14, 2005

(51) Int. Cl.
*H01L 23/48* (2006.01)
*H01L 23/52* (2006.01)
*H01L 29/40* (2006.01)

(52) U.S. Cl. ............... 257/750; 257/751; 257/752; 257/753; 257/762

(58) Field of Classification Search ............ None
See application file for complete search history.

(56) References Cited

U.S. PATENT DOCUMENTS

| 6,455,417 | B1 | 9/2002 | Bao et al. | 438/637 |
|---|---|---|---|---|
| 6,465,366 | B1 | 10/2002 | Nemani et al. | 438/778 |
| 6,479,391 | B2 | 11/2002 | Morrow et al. | 438/706 |
| 6,507,081 | B2 | 1/2003 | Smith et al. | 257/410 |
| 6,570,256 | B2 | 5/2003 | Conti et al. | 257/761 |
| 6,593,653 | B2 | 7/2003 | Sundararajan et al. | 257/751 |
| 6,602,806 | B1 | 8/2003 | Xia et al. | 438/786 |
| 6,693,356 | B2* | 2/2004 | Jiang et al. | 257/767 |
| 2002/0140103 | A1* | 10/2002 | Kloster et al. | 257/767 |
| 2003/0071358 | A1* | 4/2003 | Yin et al. | 257/758 |
| 2003/0124836 | A1* | 7/2003 | Andideh | 438/627 |
| 2003/0134499 | A1* | 7/2003 | Chen et al. | 438/618 |
| 2005/0104150 | A1* | 5/2005 | Wetzel et al. | 257/437 |
| 2005/0224908 | A1* | 10/2005 | Barth | 257/528 |

* cited by examiner

*Primary Examiner*—Duy-Vu N Deo

(57) ABSTRACT

A method for forming a composite barrier layer that also functions as an etch stop in a damascene process is disclosed. A SiC layer is deposited on a substrate in a CVD process chamber followed by deposition of a silicon nitride layer to complete the composite barrier layer. The SiC layer exhibits excellent adhesion to a copper layer in the substrate and is formed by a method that avoids reactive $Si^{+4}$ species and thereby prevents $CuSi_X$ formation. The silicon nitride layer thickness is sufficient to provide superior barrier capability to metal ions but is kept as thin as possible to minimize the dielectric constant of the composite barrier layer. The composite barrier layer provides excellent resistance to copper oxidation during oxygen ashing steps and enables a copper layer to be fabricated with a lower leakage current than when a conventional silicon nitride barrier layer is employed.

14 Claims, 5 Drawing Sheets

NITRIDE BARRIER LAYER TO PREVENT METAL (CU) LEAKAGE ISSUE IN A DUAL DAMASCENE STRUCTURE

FIELD OF THE INVENTION

The invention relates to the field of fabricating integrated circuits and other electronic devices and in particular to an improved method of forming a composite barrier layer that reduces leakage from a copper interconnect fabricated by a damascene process.

BACKGROUND OF THE INVENTION

The manufacture of an integrated circuit in a microelectronics device involves the formation of several patterned metal layers that are successively overlaid upon one another to provide horizontal and vertical electrical pathways. These pathways are often referred to as metal wiring and are typically in the form of horizontal lines as well as vias and contacts which form vertical connections between the metal lines. An intermetal dielectric (IMD) layer is generally formed between the metal wiring to insulate the electrical pathways and prevent crosstalk that degrades device performance by slowing circuit speed.

With the constant demand for microelectronics devices that have a higher performance, the industry is in the mode of reducing the width and thickness of metal layers in device circuits. In addition, aluminum is being replaced by copper as the metal of choice in wiring schemes since the latter has a higher conductivity. Unfortunately, the fabrication of microelectronic devices with copper has some drawbacks. Copper does not etch as easily as Al and therefore copper layers are typically formed by a damascene process in which an opening is etched into an interlevel dielectric (ILD) layer and then a copper deposition is performed to fill the opening. Copper ions have a high tendency to migrate into an adjacent dielectric layer and therefore a barrier layer is usually formed between an ILD layer and a copper layer. Since oxides do not block copper ions and may easily react with copper to produce undesirable copper oxides that reduce the conductivity of the copper layer, a barrier layer is frequently comprised of nitrogen in the form of a metal nitride or silicon nitride.

During a damascene process, a second copper layer is often overlaid on a first copper layer in a substrate so that an electrical contact is possible between the two layers when a current is applied. However, in the sequence of steps to form an opening in the ILD layer that is aligned above the first copper layer, the first copper layer is exposed to etchants and chemicals that may corrode or react with copper. Therefore, a barrier layer which also functions as an etch stop layer is initially deposited on the first copper layer before the ILD layer is formed. A portion of the barrier layer remains in the device to block copper ions from diffusing into the overlying ILD layer. The portion of the barrier layer that functions as an etch stop is exposed to a fluorocarbon based plasma etch during formation of an opening in the ILD layer and is exposed to an $O_2$ plasma during an ashing step to remove a photoresist pattern on the ILD layer. An important feature is that the etch stop prevents oxygen from attacking Cu to form a copper oxide. A subsequent etch step that may be based on a $CH_2F_2$ chemistry, for example, is used to remove the exposed portion of a silicon nitride barrier layer just prior to depositing the second copper layer.

A problem occurs during a popular method of depositing a silicon nitride barrier layer on the first copper layer by a plasma enhanced chemical vapor deposition (PECVD) process. The PECVD process usually involves $SiH_4$, $N_2$, and $NH_3$ as reactant gases and the application of a RF power to form a plasma in which chemical bonds are broken in the reactant gases and reactive species recombine to form a stable silicon nitride layer on a substrate. During the PECVD process, $SiH_4$ is easily converted to a reactive $Si^{+4}$ species which readily reacts with an exposed copper layer in the substrate to form a copper silicide ($CuSi_X$) layer on the copper. The thin $CuSi_X$ layer on the first copper layer is responsible for causing a metal leakage problem in the resulting device.

Another concern with a silicon nitride barrier layer is that silicon nitride has a poor adhesion to copper. Inadequate adhesion may lead to peeling of the silicon nitride barrier layer which has an adverse effect on the device performance and reliability. Therefore, a method is needed for retaining the good barrier properties of a silicon nitride layer while eliminating the copper adhesion issue and removing the concern about copper silicide formation.

An additional requirement of a barrier layer is that it should function as a dielectric layer to help insulate one metal layer from another. As such, the dielectric constant (k value) should be as low as possible. Most nitrogen containing barrier layers such as silicon nitride (k=7) or silicon oxynitride do not have a k value as low as a conventional silicon oxide (k=4) ILD layer.

A low leakage current SiCN barrier layer is described in U.S. Pat. No. 6,593,653. Although the k value can be reduced to about 4.9 in nitrogen doped silicon carbide (SiCN), this material is not as good a barrier as silicon nitride and may still result in copper silicide formation.

A SiC layer has been used as a barrier layer in a damascene process in U.S. Pat. No. 6,465,366. However, SiC is not as effective as silicon nitride in preventing copper diffusion in a copper damascene structure.

A succession of carbon doped $SiO_2$ layers with increasing carbon content are formed between a substrate and an insulating layer in U.S. Pat. No. 6,570,256. While the intermediate layers improve adhesion of the insulating layer, they are not expected to function as good copper diffusion barrier layers in a copper damascene structure.

A dual damascene scheme that includes a silicon nitride hard mask formed on an oxide layer over a silicon substrate is disclosed in U.S. Pat. No. 6,602,806. However, forming an oxide layer on a substrate that contains an exposed conducting layer such as copper is generally not desirable since copper oxide will be formed which increases the resistivity of the device.

A composite etch stop layer consisting of a very thin silicon nitride layer and a thicker silicon oxynitride layer is described in U.S. Pat. No. 6,597,081. This composite layer is primarily designed to enable a better end point detection when stopping on the etch stop layer during the plasma etch to form an opening in an ILD layer in a damascene process.

Another composite etch stop layer is formed in U.S. Pat. No. 6,455,417 and includes a carbon doped $SiO_2$ layer on a carbon doped silicon nitride layer. Both layers have a thickness from 10 to 1000 Angstroms and are deposited by a PECVD process in a damascene method.

A dual damascene method described in U.S. Pat. No. 6,479,391 involves a dual hard mask formed on an organic dielectric layer. A via and trench are formed in the hard mask layers and then the pattern is etch transferred into the underlying dielectric layer. The concern about forming a non-reactive barrier layer on a copper surface is not addressed.

SUMMARY OF THE INVENTION

An objective of the present invention is to provide a composite barrier layer that has good adhesion to copper and which prevents copper ion diffusion into adjacent dielectric layers.

A further objective of the present invention is to provide a method for forming a composite barrier layer in a damascene process in which the barrier layer is comprised of silicon nitride and has good adhesion to copper.

A still further objective of the present invention is to provide a method for forming a composite barrier layer comprised of silicon nitride on a copper layer that does not form copper silicide and thereby avoids a $CuSi_x$ leakage problem.

Yet another objective of the present invention is to provide a composite barrier layer that also functions as an etch stop layer to prevent oxygen or other chemicals from attacking an underlying copper layer during a damascene process.

Still another objective of the present invention is to provide a composite barrier layer in a damascene structure that has a lower dielectric constant and a lower leakage current than silicon nitride.

These objectives are achieved by providing a substrate in which a first copper layer is formed in a first dielectric layer and has an exposed top surface. An important feature of this invention is that a composite barrier layer is deposited on the first dielectric layer and on the first copper layer. The composite barrier layer is comprised of a bottom SiC layer with a thickness of about 100 to 150 Angstroms that is deposited with a PECVD process which preferably includes trimethylsilane or tetramethylsilane as a silicon and carbon source gas and He as a carrier gas. The number of Si—H bonds in the SiC source gas is minimized to prevent $Si^{+4}$ from forming. In a preferred embodiment, silane, $N_2$, and $NH_3$ are used as the reactant gases to deposit a silicon nitride layer as the upper layer in the composite barrier layer. The silicon nitride layer is kept as thin as possible to minimize the dielectric constant of the composite barrier layer.

Preferably, the composite barrier layer is employed in a single or dual damascene scheme in which a second dielectric layer is deposited on the composite barrier layer. A via opening is formed in the second dielectric layer by a conventional patterning and plasma etch sequence which stops on the silicon nitride layer in a dual damascene process flow. A second patterning and etching sequence is used to form a trench above the via opening in the second dielectric layer. Next, the silicon nitride layer and SiC layer at the bottom of the via are removed by a plasma etch process. The damascene process is completed by a sequence that involves depositing a conformal diffusion barrier layer on the sidewalls and bottoms of the via and trench, depositing a second metal layer that fills the via and trench, and planarizing the second metal layer to be coplanar with the second dielectric layer.

The present invention is also a damascene structure comprised of a substrate, a composite barrier layer formed on the substrate, an ILD layer formed on the composite barrier layer, an opening formed within the ILD layer that extends through the composite barrier layer, and a copper layer formed within the opening that is coplanar with the top of the ILD layer. In a preferred embodiment, the copper layer is formed on a conformal diffusion barrier layer within the opening. The composite barrier layer is comprised of a thin SiC layer and a silicon nitride layer on the SiC layer. In one embodiment, the opening is formed above a first copper layer and a second copper layer is formed within the opening to make a contact with the first copper layer.

DETAILED DESCRIPTION OF THE INVENTION

Figure 1:
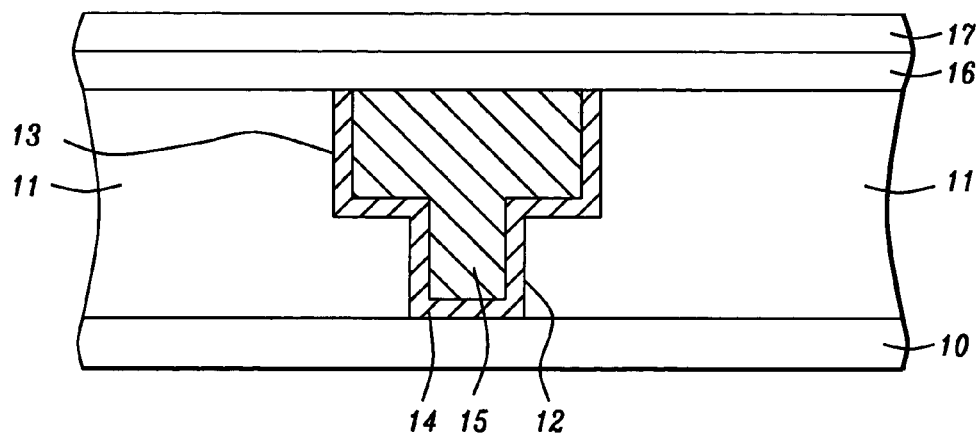
FIG. 1 is a cross-sectional view depicting a composite barrier layer of the present invention that is formed on a substrate which includes a dielectric layer and a first metal layer.

The present invention is particularly useful in forming a microelectronics device in which a conductive layer is formed on a copper layer and the device includes a composite barrier layer between the copper layer and an inter-level dielectric (ILD) layer. The composite barrier layer also serves as an etch stop layer in a damascene process flow. Although a dual damascene process is illustrated in the drawings, the composite barrier layer of the present invention may be formed on a substrate in a single damascene process or in other applications where a barrier layer also functions as an etch stop layer. It is understood that the drawings are provided by way of example and are not intended to limit the scope of the invention. In addition, the various elements within the drawings are not necessarily drawn to scale and the relative sizes thereof may be different than in an actual microelectronics device.

The invention will be described first in terms of a method of forming the composite barrier layer and its application in a damascene process flow. Then the damascene structure with the composite barrier layer will be described. Those skilled in the art will appreciate that the method and damascene structure of the present invention may be repeated a plurality of times on a substrate to form a device having a stacked arrangement of copper layers.

Referring to FIG. 1, a substrate 10 is shown that is typically monocrystalline silicon but optionally may be based on silicon-on-insulator or Si—Ge technology, for example. Substrate 10 may further include active and passive devices which are not shown in order to simplify the drawing. Also provided is a first dielectric layer 11 that has been deposited on substrate 10 by a chemical vapor deposition (CVD), PECVD, or spin-on method. The first dielectric layer 11 is preferably formed from a low k dielectric material such as fluorine doped $SiO_2$ also known as fluorosilicate glass (FSG), carbon doped $SiO_2$, a poly(arylether), a silsesquioxane polymer, or benzocyclobutene. Alternatively, the first dielectric layer 11 is comprised of $SiO_2$, phosphosilicate glass (PSG), or borophosphosilicate glass (BPSG). In the exemplary method, an opening comprised of a via 12 and an overlying trench 13 are formed in the first dielectric layer 11 by conventional patterning and plasma etching techniques.

A first conformal diffusion barrier layer 14 is deposited on the sidewalls and bottoms of the via 12 and the trench 13 by a PECVD, atomic layer deposition (ALD), or a metal organic CVD process. Next, a first copper layer 15 is deposited to fill the via 12 and trench 13 by an electroplating or electroless method, for example. Typically, the first copper layer 15 and diffusion barrier layer 14 are planarized by a chemical mechanical polish (CMP) process. Although the first copper layer 15 is shown as a filled trench and via, other shapes are possible such as a trench formed above a plurality of vias or a trench by itself in a single damascene scheme as appreciated by those skilled in the art.

A key feature of the present invention is the formation of a composite barrier layer comprised of a lower silicon carbide (SiC) layer 16 and an upper silicon nitride layer 17 formed on the first copper layer 15 and on the first dielectric layer 11. The composite barrier layer is preferably formed in a process chamber of a CVD tool such as one supplied by Applied Materials of Santa Clara, Calif. or Novellus of San Jose, Calif. It is understood that a CVD tool may have multiple process chambers in which a first film may be deposited on a substrate in a first chamber and a second film may be deposited on the first film in a second chamber without exposing the substrate to air or removing the substrate from the CVD tool.

The SiC layer 16 having a thickness of about 100 to 150 Angstroms is preferably deposited by a process sequence that first involves loading the substrate 10 with overlying first dielectric layer 11, diffusion barrier layer 14, and first copper layer 15 onto a chuck in a CVD process chamber (not shown). The process chamber is stabilized at a reduced pressure by removing air through an exit port with a vacuum. Meanwhile, the temperature in the process chamber is increased to promote a faster deposition rate later in the process sequence. A silicon and carbon source gas which is preferably trimethylsilane (3MS) or tetramethylsilane (4MS) is flowed into the chamber through a distribution plate or the like. The number of Si—H bonds in the silicon and carbon source gas is minimized to prevent the formation of $Si^{+4}$ during the subsequent deposition. Note that a Si—H bond energy (98 eV) is less than a Si—$CH_3$ bond energy (102 eV) and therefore a Si—H bond is more easily broken. As a result, $SiH_4$ is easily converted to $Si^{+4}$ while tetramethylsilane does not form a $Si^{+4}$ species.

Optionally, other silicon and carbon source gases may be employed provided that a $Si^{+4}$ species is not generated in the SiC deposition process. Additionally, He or Ar is preferably flowed into the chamber as a carrier gas for the silicon and carbon source gas. A plasma is generated by applying a RF power. It is understood that He or Ar and the silicon and carbon source gas may be flowed into the process chamber for a few seconds to stabilize the pressure before the RF power is applied.

Preferred deposition conditions are a 3MS/4MS flow rate of about 300 to 500 standard cubic centimeters per minute (sccm), a He flow rate from about 600 to 1000 sccm, a RF power between about 300 and 500 Watts, a chamber pressure of 10 to 12 Torr, and a chamber temperature of about 200° C. to 450° C. With these conditions, a SiC layer 16 is deposited at the rate of about 300 to 800 Angstroms per minute. The SiC layer 16 is usually deposited for a predetermined period of time which is about 6 to 20 seconds. In an alternative embodiment, an amorphous SiC (α-SiC:H) layer 16 is formed under similar process conditions.

In one embodiment, the silicon nitride layer 17 is deposited in the same CVD process chamber as the SiC layer 16. Once an acceptable thickness of the SiC layer 16 is reached, the RF power is stopped and $SiH_4$, $N_2$, and $NH_3$ are flowed into the chamber for a period of about 10 to 20 seconds until He and 3MS/4MS are purged and a stable pressure is achieved. A RF power is applied once again which initiates the deposition of silicon nitride. The deposition step is continued until an acceptable thickness of the silicon nitride layer 17 is reached which is about 300 to 500 Angstroms. The preferred process conditions for the silicon nitride deposition are a $SiH_4$ flow rate of 60 to 100 sccm, a $N_2$ flow rate of 3000 to 5000 sccm, a $NH_3$ flow rate of about 25 to 45 sccm, a RF power between about 350 and 500 Watts, a chamber pressure of 2 to 5 Torr, and a chamber temperature of 200° C. to 450° C. With these conditions, a silicon nitride layer 17 is deposited at the rate of about 2500 to 3500 Angstroms per minute. Preferably, the temperature of the silicon nitride deposition is similar to the temperature of the SiC deposition so there is no delay in waiting for temperature to stabilize for the silicon nitride deposition step.

Alternatively, once an acceptable SiC layer 16 is reached, the substrate 10 is removed from the process chamber and is transferred to another process chamber in the same CVD tool where the silicon nitride layer 17 is deposited using the previously described process conditions. Note that the silicon nitride deposition is usually performed for a predetermined period of time which is about 5 to 15 seconds.

The composite barrier layer of the present invention is an advantage over prior art in that the best barrier properties of SiC and silicon nitride are retained while mitigating less desirable properties. For example, the SiC layer 16 provides excellent adhesion to the first copper layer 15 which is combined with the excellent barrier capability of silicon nitride layer 17. Since the SiC layer 16 is formed first in the deposition sequence, there is no concern about $CuSi_x$ formation that is normally associated with a silicon nitride deposition. Moreover. the SiC layer 16 is formed without generating the $Si^{+4}$ species during the deposition step which avoids the formation of $CuSi_x$ on the first copper layer 15 producing an interface between the copper layer 15 and the composite barrier layer, particularly SiC layer 16. that is free of $CuSi_x$. A minimal number of Si—H bonds in the silicon and carbon source gas also results in less dangling Si bonds in the deposited SiC layer that will lead to a more stable SiC layer 16, one that will be less likely to scavenge oxygen to form unstable Si—OH bonds. Furthermore, the composite barrier layer provides an excellent etch stop property which prevents oxidation of copper layer 15 during subsequent processes. Other advantages of the composite barrier layer will become apparent during a description of its application in a damascene process flow.

The improved adhesion realized by replacing a silicon nitride layer with a SiC layer on a copper layer is demonstrated in a conventional stud pull test. A stud is glued to the top surface of a barrier layer film that has been deposited on a copper layer and is pulled perpendicular to the barrier film until the barrier film separates from the copper layer. The load required for the separation to occur is recorded and converted to a stress value as shown in Table 1. The results indicate that a higher load (higher pressure) is needed to separate the copper layer from the composite barrier layer of the present invention than for separation of a conventional silicon nitride barrier layer from a copper surface.

TABLE 1

Stud Pull Test Results for Barrier Layer Adhesion to Copper

|  | Avg. (Kg/cm$^2$) | Ave. (Mpa) |
|---|---|---|
| Silicon nitride barrier layer | 673 | 66 |
| Composite layer of Si$_3$N$_4$ on SiC | 723 | 70.9 |

Figure 2:
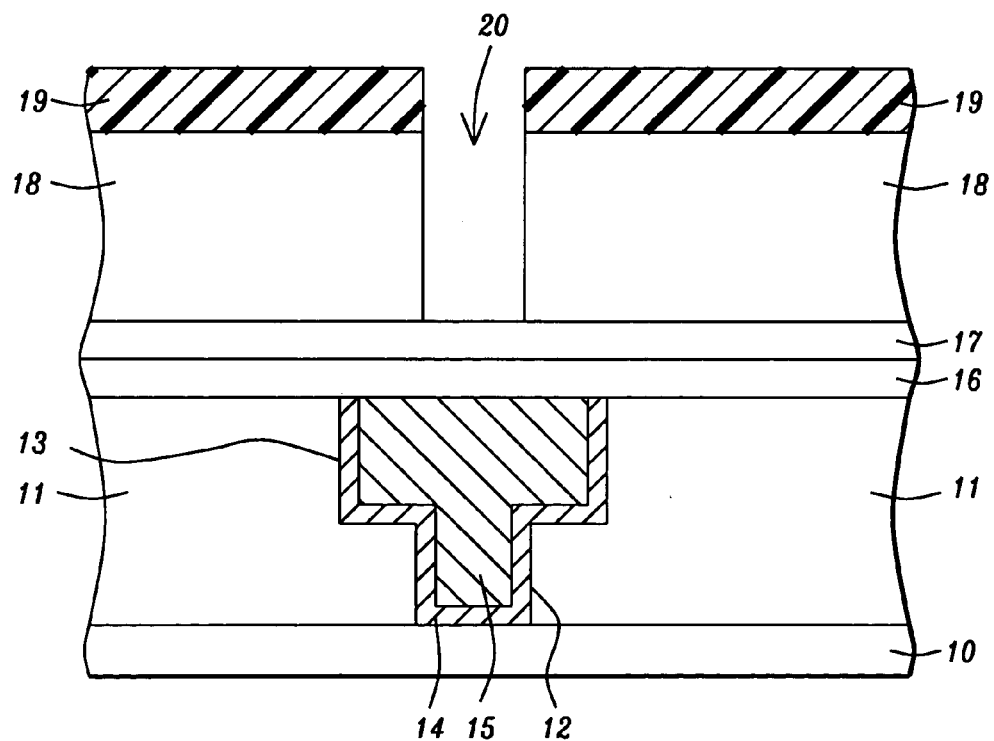
FIGS. 2–5 are cross-sectional views showing the incorporation of a composite barrier of the present invention in a dual damascene process flow to form a second metal layer on the first metal layer.

Referring to FIG. 2, the damascene process is continued by depositing a second dielectric layer 18 on the silicon nitride layer 17 by a CVD, PECVD, or spin-on method. The second dielectric layer 18 is selected from the same group of materials as described for the first dielectric layer 11. In one embodiment, the first dielectric layer 11 and the second dielectric layer 18 are comprised of FSG with a thickness between about 4000 and 10000 Angstroms. Following the deposition of an FSG dielectric layer, a post-deposition process consisting of an anneal in an inert atmosphere at about 300° C. to 450° C. or a plasma treatment known to those skilled in the art may be used to densify the FSG layer and prevent water absorption in subsequent steps. Additionally, a cap layer (not shown) comprised of silicon carbide, silicon nitride, or silicon oxynitride may be deposited on the second dielectric layer 18. The cap layer serves as a stop layer during a later planarization step and may function as an anti-reflection coating (ARC) during a subsequent patterning step.

Next, a first photoresist layer 19 is coated and patterned on the second dielectric layer 18 to form a via opening 20 that is aligned over the first copper layer 15. Optionally, in the absence of a cap layer on the second dielectric layer 18, an organic ARC layer may be formed by spin coating and baking a commercially available ARC material on the second dielectric layer before the first photoresist layer 19 is coated. The via opening 20 is transferred through the second dielectric layer 18 by a plasma etch process that is typically based on a fluorocarbon chemistry. The plasma etch stops on the silicon nitride layer 17 since the oxide etch has a high selectivity to a nitride layer. Silicon nitride provides an advantage over other etch stop layers comprised of oxide or SiC because it has a higher etch selectivity to an oxide based second dielectric layer. Additionally, the end point signal for the etch process is more distinct for a silicon nitride etch stop than for an etch stop layer comprised of an oxide which prevents over etching that could damage the first copper layer 15.

Figure 3:
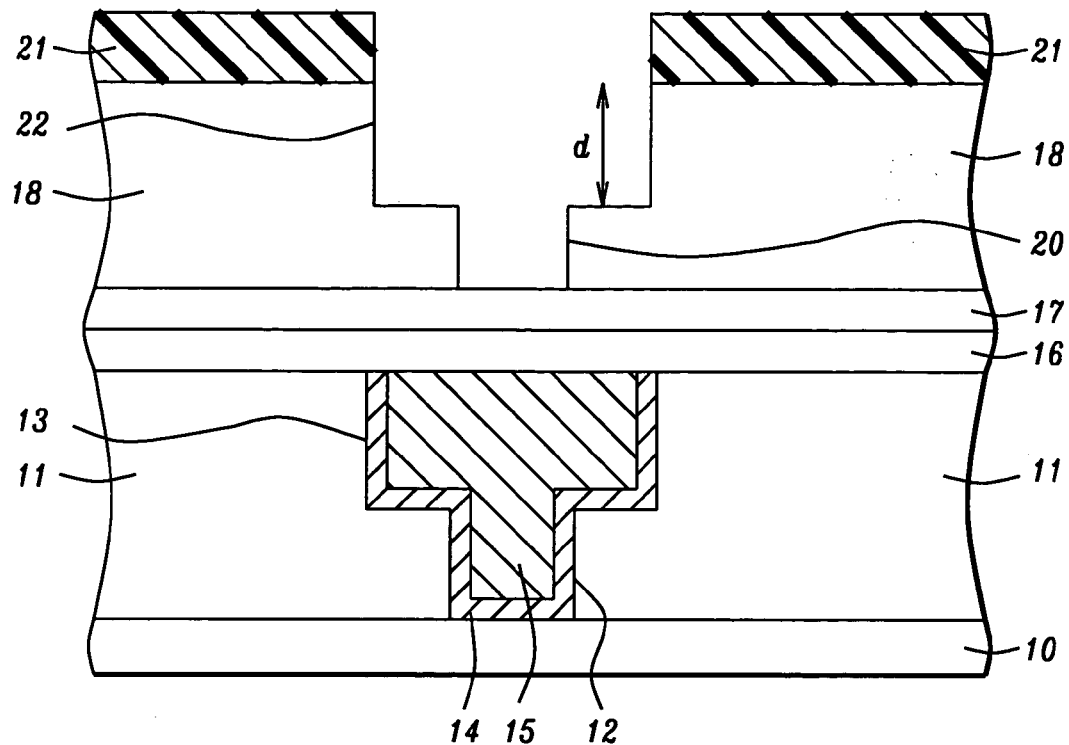

Referring to FIG. 3, the first photoresist layer 19 is stripped by an oxygen ashing process. It is understood that the O$_2$ ashing step may involve other oxidants such as CO$_2$. The composite barrier layer comprised of silicon nitride layer 17 and SiC layer 16 protects the first copper layer 15 by preventing reactive oxygen species from attacking copper and forming undesirable copper oxides. In the embodiment where an organic ARC layer is formed on the second dielectric layer 18, the organic ARC is removed simultaneously with the first photoresist layer 19.

Figure 6:
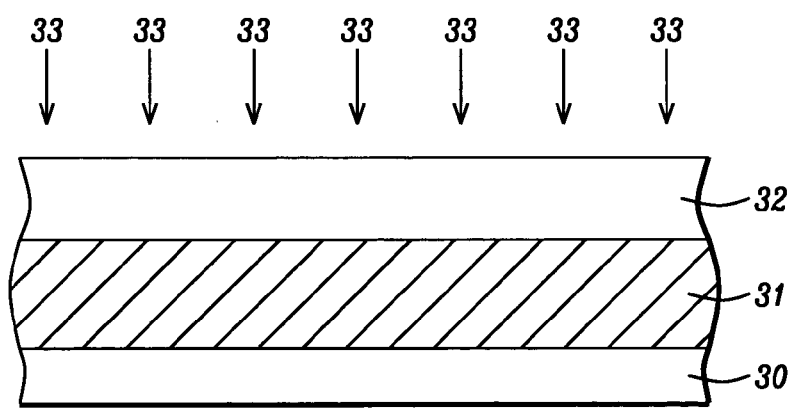
FIG. 6 is cross-sectional view illustrating a test in which an $O_2/CO_2$ plasma is applied to a barrier layer to determine the effectiveness of the barrier layer in preventing an underlying copper layer from being oxidized.

Table 2 shows that a SiC etch stop layer offers better protection against copper oxidation than a silicon nitride layer during an oxygen ashing step. The results in Table 2 were obtained from a test as depicted in FIG. 6 in which a copper layer 31 is deposited on a substrate 30. A barrier layer 32 is then formed on the copper layer 30 by a PECVD process. A CO$_2$ plasma treatment which simulates an actual ashing process is performed with the following conditions: a CO$_2$ flow rate of 300 to 500 sccm, a RF power of 100 to 400 Watts, a chamber pressure of 2 to 4 Torr, and a substrate temperature of 200° C. to 450° C. for a period of 15 seconds. The copper layer 31 reflectivity was measured by a Nano-Spec 9100 tool available from Nanometrics Inc. of Milpitas, Calif. before and after the deposition of barrier layer 32 as well as following the CO$_2$ plasma treatment 33. The results indicate that a 120 Angstrom thick silicon nitride barrier layer 32 allows some oxidation of the copper layer 31 to occur as shown by the decrease in reflectivity after the CO$_2$ treatment. On the other hand, an 80 Angstrom or 120 Angstrom thick SiC film which is deposited according to the method previously described for the SiC layer 16 prevents oxidation of the copper layer 31 as indicated by a similar or slightly higher copper reflectivity.

By combining the etch selectivity of silicon nitride as mentioned previously with the high resistance to oxidation provided by a SiC layer, the composite layer of the present invention has two valuable properties offered by no single barrier or etch stop layer.

TABLE 2

Effectiveness of Barrier Layers in Preventing Cu Oxidation

|  |  | Copper Reflectivity relative to Silicon | | |
|---|---|---|---|---|
|  | Thickness | Before barrier deposition | After barrier deposition | After 15 sec. CO$_2$ plasma |
| Silicon nitride | 120 Ang. | 156.32% | 150.78% | 149.86% |
| SiC | 80 Ang. | 156.11% | 153.01% | 153.2% |
| SiC | 120 Ang. | 155.79% | 151.02% | 153.09% |

Returning to FIG. 3, a second photoresist layer 21 is coated and patterned on the second dielectric layer 18 to form a trench 22 that is aligned above the via 20. Optionally, an inert plug (not shown) may be formed in the via 20 by a method known to those skilled in the art to allow a more planar coating of the second photoresist layer 21. Furthermore, a second organic ARC may be formed on the second dielectric layer 18 prior to coating the second photoresist layer 21 to control reflectivity during the patterning step. The trench 22 is transferred into the second dielectric layer 18 to a give a trench depth d of about 2500 to 4000 Angstroms. The trench etch is performed with a fluorocarbon based plasma and silicon nitride layer 17 serves as an etch stop to prevent an overetch that could damage the underlying first copper layer 15.

Figure 4:
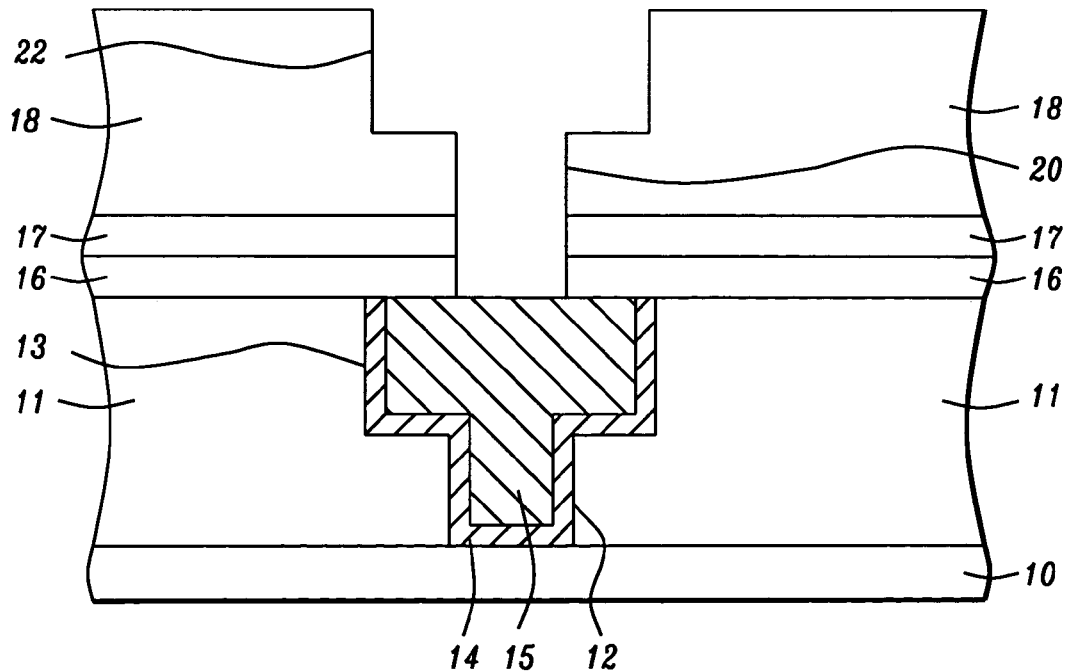

Referring to FIG. 4, the second photoresist layer 21 is stripped with an oxygen based plasma. In an alternative embodiment, the second organic ARC and optional inert plug are simultaneously removed with the second photoresist layer. As mentioned previously, the SiC layer 16 is especially useful in blocking reactive oxygen containing species from reaching the first copper layer 15 in an ashing process and thereby prevents copper oxides from forming. The via opening 20 may then be transferred through silicon nitride layer 17 by a plasma etch based on C$_5$F$_8$/Ar/CO chemistry, for example, and through SiC layer 16 with a N$_2$/CF$_4$/Ar plasma etch that is preferably under "soft" conditions to avoid damaging the first copper layer 15. Alternatively, the etch through the silicon nitride layer 17 and SiC layer 16 may be performed in the same step which is comprised of a N$_2$ flow rate of about 40 to 100 sccm, a CF$_4$ flow rate of about 50 to 150 sccm, and a chamber pressure of from 100 to 200 mTorr.

Figure 5:
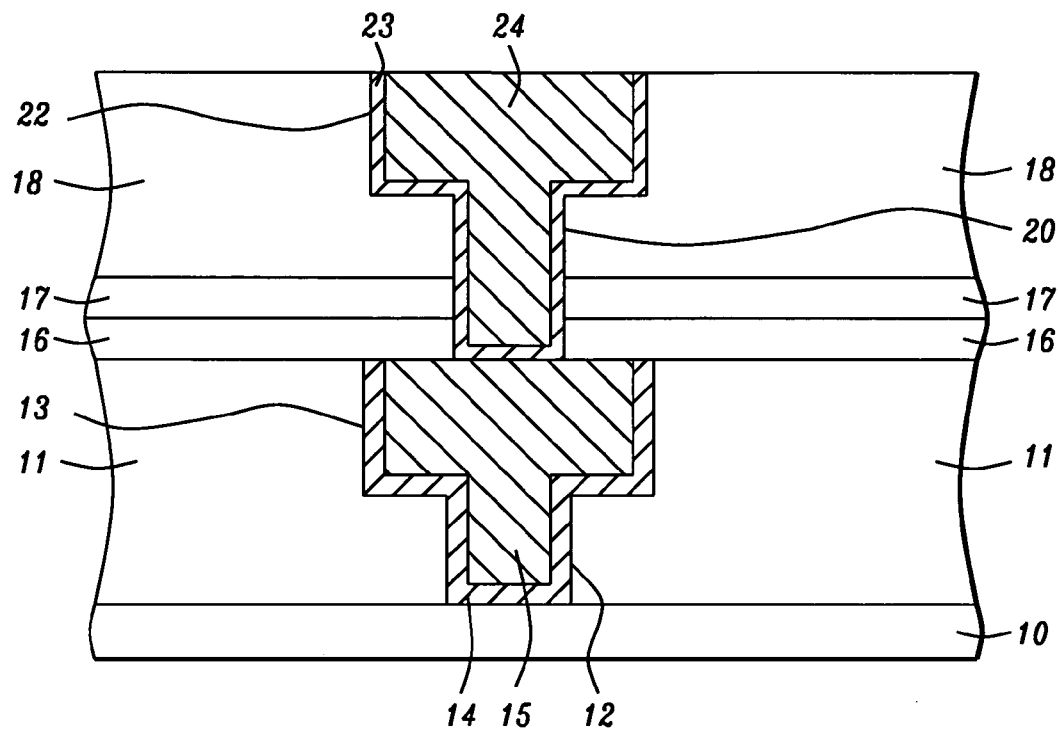

Referring to FIG. 5, a conformal diffusion barrier layer 23 that is preferably one or more of Ta, TaN, Ti, TiN, TaSiN, W, or WN is deposited by a PECVD, metal organic CVD, or atomic layer deposition (ALD) process on the sidewalls and bottom of the via 20 and trench 22. Optionally, the diffusion barrier layer 23 is formed on the sidewalls and bottom of the trench 22 and on the sidewalls of the via 20. A conductive layer 24 that is preferably copper is then deposited on the diffusion barrier layer 23 by a conventional method that may include first depositing a seed layer (not shown) on the diffusion barrier layer prior to an electroplating or electroless process which deposits the conductive layer 24, for example. The conductive layer 24 is deposited to a level that fills the via 20 and trench 22. A subsequent planarization process that is typically a CMP step is used to lower the level of the conductive layer 24 and diffusion barrier layer 23 to be coplanar with the top of the second dielectric layer 18. In the embodiment where a cap layer is formed on the second dielectric layer 18, the cap layer may remain on the second dielectric layer after the planarization process.

Figure 7:
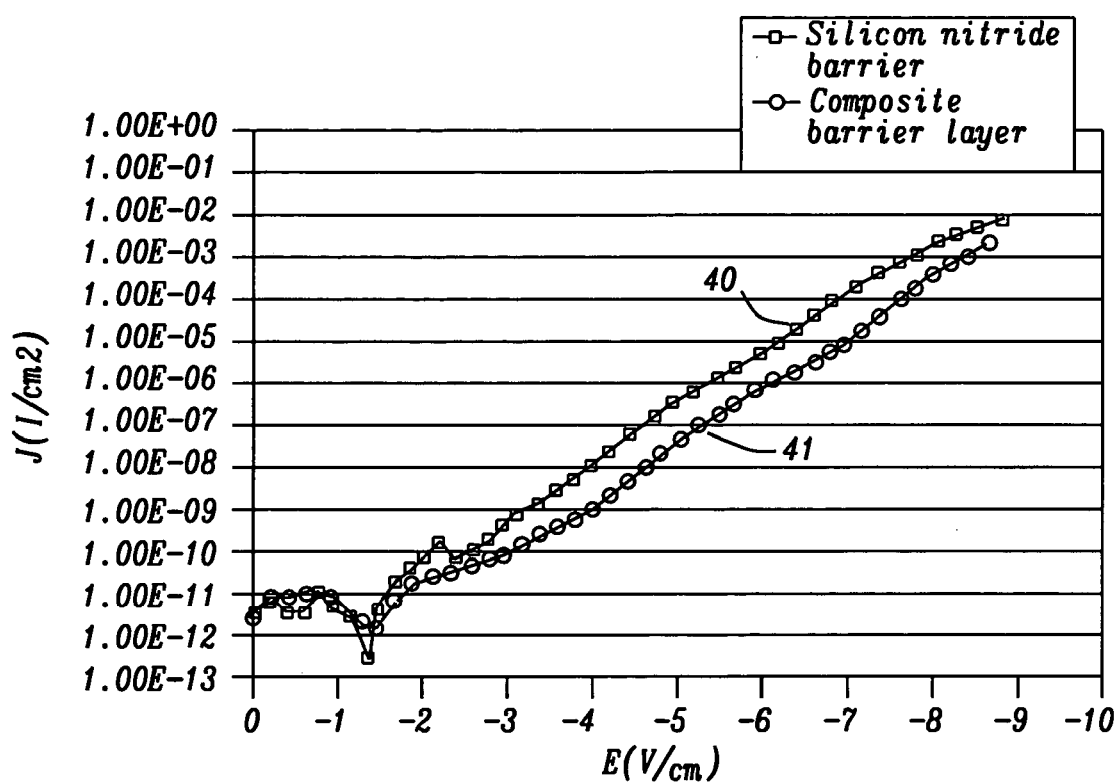
FIGS. 7–8 are plots that show a lower leakage current in a device having a composite barrier layer of the present invention compared to a conventional silicon nitride barrier layer.
Figure 8:
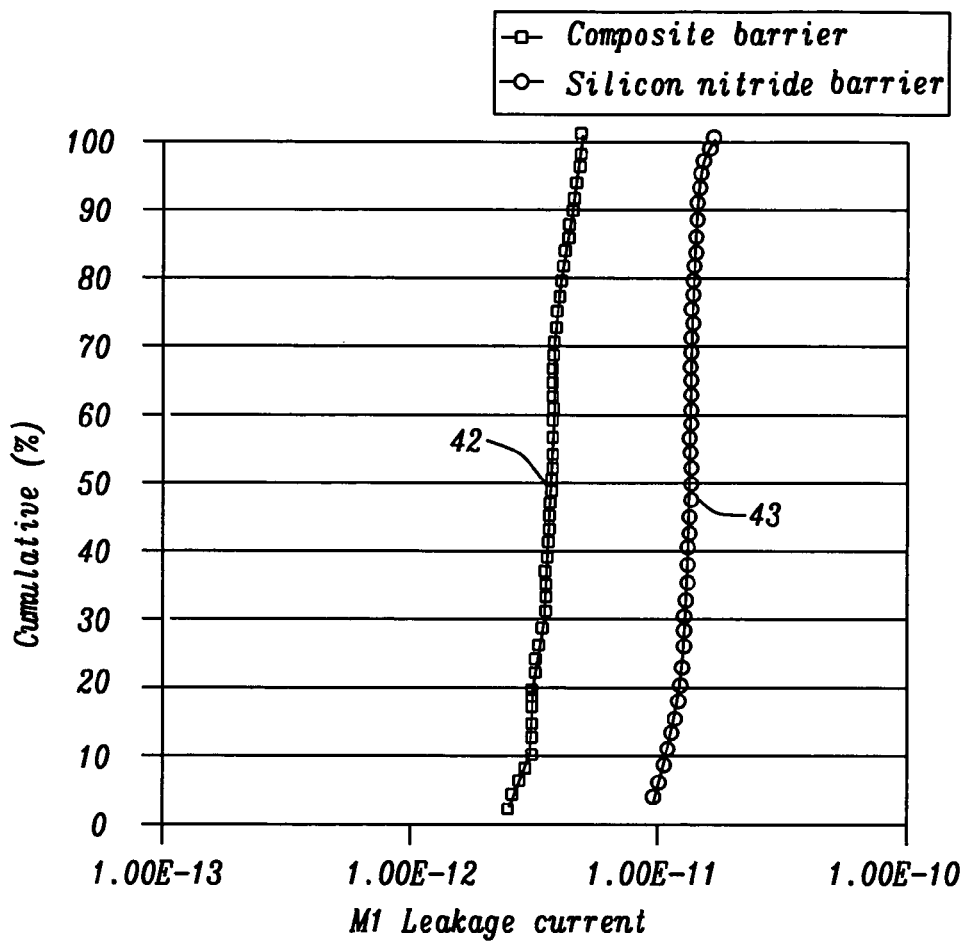

A further advantage provided by the composite barrier layer of the present invention is a low leakage current from a conductive layer that is formed adjacent to the composite barrier layer. Referring to FIG. 7, curve 41 represents the leakage current from the conductive layer 24 formed by a damascene process according to a method of the present invention. In this example, the conductive layer 24 is copper and the composite layer is comprised of a 300 to 500 Angstrom thick silicon nitride layer 17 on a 100 to 150 Angstrom silicon carbide layer 16 as shown in FIG. 5. Curve 40 represents a higher leakage current when a conventional 500 Angstrom thick silicon nitride barrier layer is used instead of the composite barrier layer. Referring to FIG. 8, a lower leakage current (curve 42) is observed for an M1 copper layer which is fabricated as the conductive layer in a damascene structure that includes a composite barrier layer as described with respect to FIGS. 2–5 than when a conventional silicon nitride barrier layer (curve 43) is used adjacent to an M1 copper layer.

Figure 9:
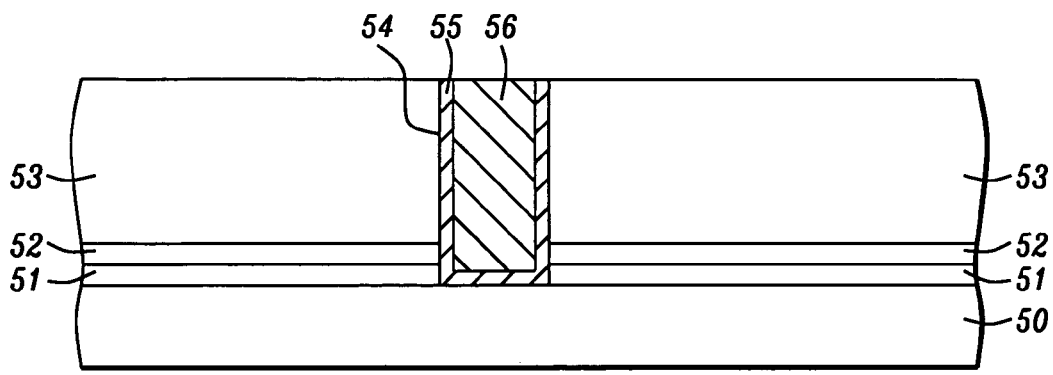
FIG. 9 is a cross-sectional view showing a single damascene structure that includes the composite barrier layer of the present invention.

The present invention is also a damascene structure that includes a composite barrier layer comprised of an upper silicon nitride layer and a lower SiC layer formed on a substrate. Although a single damascene structure is depicted in FIG. 9, the composite barrier layer may also be formed as part of a dual damascene structure. Furthermore, in a dual damascene structure, the present invention anticipates various designs including one in which a first composite barrier layer, a first dielectric layer, a second composite barrier layer, and a second dielectric layer are sequentially formed on substrate. In this case, the second composite barrier layer functions primarily as an etch stop layer during the trench formation as is understood by those skilled in the art.

Referring to FIG. 9, a substrate 50 is shown that is typically monocrystalline silicon but optionally is based on Si—Ge, silicon-on-insulator, or other substrates that are used in the industry. Substrate 50 may be further comprised of active and passive devices including conductive layers and dielectric layers (not shown). In one embodiment, the substrate 50 has a first conductive layer (not shown) with an exposed top surface.

A key feature of the present invention is a composite barrier layer comprised of a lower SiC layer 51 and an upper silicon nitride layer 52. The composite barrier layer is preferably fabricated according to a previously described PECVD process sequence in which the SiC and silicon nitride layers 51, 52 are deposited in the same process chamber of a CVD tool. The SiC layer 51 has a thickness of about 100 to 150 Angstroms and is particularly useful in the embodiment in which the first conductive layer with an exposed surface in substrate 50 is copper since SiC has excellent adhesion to copper. The SiC layer 51 enables a silicon nitride layer 52 to be incorporated in the composite barrier layer without concern for silicon nitride adhesion to copper which is often problematic. In an alternative embodiment, the bottom layer in the composite barrier layer is an amorphous silicon carbide (α-SiC:H) layer.

The silicon nitride layer 52 has a thickness between about 250 and 500 Angstroms. When the composite barrier layer is formed on an underlying first conductive layer, the silicon nitride layer 52 serves as a barrier to prevent metal diffusion into an overlying dielectric layer. The thickness of the silicon nitride layer 52 is kept as thin as possible to minimize the dielectric constant of the composite barrier layer.

A dielectric layer 53 is formed on the silicon nitride layer 52 and is preferably comprised of a low k dielectric material such as carbon doped $SiO_2$, fluorine doped $SiO_2$, a silsesquioxane polymer, a polyarylether, or benzocyclobutene. The dielectric layer thickness is about 4000 to 10000 Angstroms. In an alternative embodiment, the dielectric layer 53 may be comprised of silicon oxide, PSG, or BPSG.

Within the dielectric layer 53, there is an opening 54 which may be a via, trench, or contact hole. In the exemplary embodiment, opening 54 is a via, contact hole, or trench. In an alternative embodiment where the composite barrier layer is formed in a dual damascene structure, the opening 54 is a trench formed above a via. The opening 54 extends through the composite barrier layer. In the embodiment where a first conductive layer is coplanar with the top surface of the substrate 50, the opening 54 is aligned so that a portion of the first conductive layer is exposed. There is a conformal diffusion barrier layer 55 comprised of one or more of Ta, TaN, Ti, TiN, TaSiN, W, or WN on the sidewalls and bottom of the opening 54. Alternatively, the diffusion barrier layer 55 is formed on the sidewalls of the opening 54. A second conductive layer 56 is formed on the conformal diffusion barrier layer 55 that fills the opening and has a top surface that is coplanar with the top of the dielectric layer 53. The second conductive layer 56 is preferably copper but also may be Al/Cu, W, or another conductive material used in the art.

Besides the valuable properties of excellent adhesion (from SiC) and superior barrier capability (from silicon nitride) that is available in no single layer barrier, the damascene structure with the composite layer of the present invention has the added advantage of a low leakage current. As illustrated in FIG. 7, curve 41 represents the leakage current from a second conductive layer 56 in a damascene structure according to the present invention while curve 40 represents a higher leakage current from a second conductive layer in a conventional damascene structure in which SiC layer 51 and silicon nitride layer 52 are replaced by a conventional silicon nitride barrier layer. Referring to FIG. 8, a lower leakage current (curve 42) is observed for an M1 copper layer in a damascene structure according to the present invention while curve 43 indicates a higher leakage current for an M1 copper layer in a conventional damascene structure having a silicon nitride barrier layer.

While this invention has been particularly shown and described with reference to, the preferred embodiments thereof, it will be understood by those skilled in the art that various changes in form and details may be made without departing from the spirit and scope of this invention.

We claim:

1. A damascene structure that includes a composite barrier layer formed on a substrate, comprising:
(a) a substrate comprised of a cooper layer;
(b) a composite barrier layer comprised of an upper silicon nitride layer and a lower silicon carbide layer on said substrate;
(c) a dielectric layer formed directly on the upper silicon nitride layer;
(d) an opening with sidewalls in said dielectric layer that extends through said composite barrier layer and exposes a portion of said copper layer;
(e) a conformal diffusion barrier layer on the sidewalls of said opening; and
(f) a planarized conductive layer on said conformal diffusion barrier layer that fills said opening, said planarized conductive layer is coplanar with the top of said dielectric layer, wherein an interface between said copper layer and said composite barrier layer is free of $CuSi_x$.

2. The damascene structure of claim 1 wherein the silicon carbide layer has a thickness of about 100 to 150 Angstroms.

3. The damascene structure of claim 1 wherein the silicon carbide layer is comprised of amorphous silicon ($\alpha$-SiC:H).

4. The damascene structure of claim 1 wherein the silicon nitride layer has a thickness of about 300 to 500 Angstroms.

5. The damascene structure of claim 1 wherein the dielectric layer is comprised of fluorosilicate glass (FSG), carbon doped SiO2, or a silsesquioxane polymer and has a thickness between about 4000 and 10000 Angstroms.

6. The damascene structure of claim 1 wherein the diffusion barrier layer is comprised of one or more of Ta, TaN, Ti, TiN, TaSiN, W, or WN.

7. The damascene structure of claim 1 wherein the conductive layer is comprised of copper.

8. A dual damascene structure that includes a composite barrier layer, comprising:
(a) a substrate;
(b) a composite barrier layer comprised of an upper silicon nitride layer and a lower SiC layer on said substrate;
(c) a dielectric layer formed directly on the composite barrier layer;
(d) a dual damascene opening with sidewalls in said dielectric layer, said dual damascene opening extending through said composite barrier layer and exposing an upper portion of a dual damascene copper structure disposed below said dual damascene opening;
(e) a conformal diffusion barrier layer on the sidewalls of said opening; and
(f) a conductive layer on said conformal diffusion barrier layer, filling said opening and having an upper surface that is coplanar with the top of said dielectric layer, wherein an interface between the dual damascene copper structure and the composite barrier layer is free of $CuSi_x$.

9. The dual damascene structure of claim 8 wherein the silicon carbide layer has a thickness of about 100 to 150 Angstroms.

10. The dual damascene structure of claim 8 wherein the silicon carbide layer is comprised of amorphous silicon carbide ($\alpha$-SiC:H).

11. The dual damascene structure of claim 8 wherein the silicon nitride layer has a Thickness of about 300 to 500 Angstroms.

12. The dual damascene structure of claim 8 wherein the dielectric layer is comprised of FSG, carbon doped SiO2, or a silsesquioxane polymer and has a thickness between about 4000 and 10000 Angstroms.

13. The dual damascene structure of claim 8 wherein the diffusion barrier layer is comprised of one or more of Ta, TaN, Ti, TiN, TaSiN, W, or WN.

14. The dual damascene structure of claim 8 wherein the conductive layer is comprised of copper.

* * * * *